United States Patent
Lee et al.

(10) Patent No.: US 9,544,993 B2
(45) Date of Patent: Jan. 10, 2017

(54) FOLDABLE DISPLAY APPARATUS AND METHOD OF MANUFACTURING THE SAME

(71) Applicant: Samsung Display Co., Ltd., Yongin, Gyeonggi-Do (KR)

(72) Inventors: Chung-Seok Lee, Yongin (KR); Bong-Hyun You, Yongin (KR); Seong-Heon Cho, Yongin (KR)

(73) Assignee: Samsung Display Co., Ltd. (KR)

( * ) Notice: Subject to any disclaimer, the term of this patent is extended or adjusted under 35 U.S.C. 154(b) by 270 days.

(21) Appl. No.: 14/265,077

(22) Filed: Apr. 29, 2014

(65) Prior Publication Data

US 2015/0043187 A1     Feb. 12, 2015

(30) Foreign Application Priority Data

Aug. 7, 2013    (KR) ........................ 10-2013-0093793

(51) Int. Cl.
| | |
|---|---|
| H05K 7/10 | (2006.01) |
| H05K 1/02 | (2006.01) |
| H05K 1/14 | (2006.01) |
| H05K 1/11 | (2006.01) |
| H05K 3/28 | (2006.01) |

(Continued)

(52) U.S. Cl.
CPC .............. *H05K 1/028* (2013.01); *H05K 1/148* (2013.01); *H05K 1/0268* (2013.01); *H05K 1/0281* (2013.01); *H05K 1/117* (2013.01); *H05K 3/282* (2013.01); *H05K 3/323* (2013.01); *H05K 3/361* (2013.01); *H05K 2201/09481* (2013.01); *H05K 2201/09827* (2013.01); *H05K 2201/10128* (2013.01)

(58) Field of Classification Search
CPC .... G02F 1/13306; G02F 1/1303; H05K 3/281; H05K 1/0268; H05K 1/028; H05K 1/0281; H05K 1/117; H05K 1/148; H05K 2201/09481; H05K 2201/09827; H05K 2201/10128; H05K 3/282; H05K 3/323; H05K 3/361; H01L 2924/01078; G06F 1/1616; G06F 1/1683
USPC ................... 349/58, 139–143, 147; 353/119; 361/679.01–679.02, 679.21, 679.26, 361/679.27, 679.28, 748–751, 755, 780
See application file for complete search history.

(56) References Cited

U.S. PATENT DOCUMENTS

| | | |
|---|---|---|
| 4,195,431 A | 4/1980 | Neufeld |
| 5,813,748 A * | 9/1998 | Maxymych ............ A47G 23/00 206/564 |
| 6,954,184 B2 | 10/2005 | Kurashima et al. |

(Continued)

FOREIGN PATENT DOCUMENTS

| | | |
|---|---|---|
| JP | 2005-070121 | 3/2005 |
| JP | 2011-150259 | 8/2011 |

(Continued)

*Primary Examiner* — Jeremy C Norris
*Assistant Examiner* — Roseline Alicea Rivera
(74) *Attorney, Agent, or Firm* — Innovation Counsel LLP

(57) ABSTRACT

Provided is a foldable display apparatus that is foldable along a folding line. The foldable display apparatus includes a first display panel for displaying a first image, a second display panel for displaying a second image, wherein the second display panel is spaced apart from the first display panel, and a flexible electric connection unit disposed between the first and second display panels and electrically connecting the first and second display panels, the flexible electric connection unit comprising a groove overlapping with the folding line.

20 Claims, 7 Drawing Sheets

(51) Int. Cl.
*H05K 3/32* (2006.01)
*H05K 3/36* (2006.01)

(56) References Cited

U.S. PATENT DOCUMENTS

| | | | |
|---|---|---|---|
| 7,233,382 B2 | 6/2007 | Yamaji et al. | |
| 7,301,509 B2 | 11/2007 | Yun et al. | |
| 7,433,179 B2* | 10/2008 | Hisano | G06F 1/1616 |
| | | | 345/156 |
| 2006/0001819 A1 | 1/2006 | Maeng et al. | |
| 2006/0132425 A1 | 6/2006 | Kim et al. | |
| 2008/0174975 A1* | 7/2008 | Kurihara | H01L 23/49572 |
| | | | 361/751 |
| 2012/0014052 A1* | 1/2012 | Senatori | G06F 1/1683 |
| | | | 361/679.3 |
| 2012/0262870 A1* | 10/2012 | Leung | G06F 1/1626 |
| | | | 361/679.27 |
| 2013/0037832 A1 | 2/2013 | Kang | |

FOREIGN PATENT DOCUMENTS

| | | | |
|---|---|---|---|
| JP | 2011150259 A | * | 8/2011 |
| JP | 2013-038379 | | 2/2013 |
| KR | 10-2008-0059783 A | | 7/2008 |
| KR | 10-2012-0052764 | | 5/2012 |

* cited by examiner

FOLDABLE DISPLAY APPARATUS AND METHOD OF MANUFACTURING THE SAME

RELATED APPLICATIONS

This application claims the benefit of Korean Patent Application No. 10-2013-0093793 filed on Aug. 7, 2013, the disclosure of which is incorporated by reference herein in its entirety.

BACKGROUND

1. Technical Field

The present disclosure relates to a foldable display apparatus and a method of manufacturing the foldable display apparatus.

2. Description of the Related Art

The range of uses for display apparatuses has diversified in recent years due to the reduction in form factor and weight of the display apparatuses.

For example, a foldable display apparatus is a display apparatus that can be folded by a user, therefore making the display apparatus easily portable. In addition, when the display apparatus is unfolded, a large sized screen can be realized. The foldable display apparatus may be provided in mobile phones, televisions, display monitors, electronic readers, etc.

In some instances, the foldable display apparatus may include a plurality of display panels that can be folded along a folding line, and the plurality of display panels may be used for different applications.

SUMMARY

The present disclosure is directed to a foldable display apparatus and a method of manufacturing the foldable display apparatus.

According to some embodiments of the inventive concept, a foldable display apparatus foldable along a folding line is provided. The foldable display apparatus includes a first display panel for displaying a first image, a second display panel for displaying a second image, wherein the second display panel is spaced apart from the first display panel, and a flexible electric connection unit disposed between the first and second display panels and electrically connecting the first and second display panels, the flexible electric connection unit comprising a groove overlapping with the folding line.

In some embodiments, the flexible electric connection unit may include a conductive layer, a protection layer disposed on the conductive layer, and a wiring pattern electrically connected to the conductive layer and the first and second display panels, and wherein the groove is disposed on the protection layer.

In some embodiments, the protection layer may include a penetration, and the wiring pattern is disposed in the penetration, the wiring pattern comprising a test region for performing an electrical test on the wiring pattern.

In some embodiments, the foldable display apparatus may further include a shielding layer covering the test region and spaced apart from the folding line.

In some embodiments, the shielding layer may be disposed covering the test region after the electrical test is performed on the wiring pattern.

In some embodiments, the wiring pattern may include at least one first wiring pattern electrically connected to the first display panel via a first connection member, and at least one second wiring pattern electrically connected to the second display pattern via a second connection member.

In some embodiments, at least one first wiring pattern and at least one second wiring pattern may be spaced apart from each other relative to the folding line.

In some embodiments, the foldable display apparatus may further include a cover layer disposed on a first surface of the conductive layer, wherein the first surface of the conductive layer is opposite to a second surface of the conductive layer facing the protection layer.

In some embodiments, the foldable display apparatus may further include a fold guide member disposed in contact with a first surface of the cover layer, wherein the first surface of the cover layer is opposite to a second surface of the cover layer facing the conductive layer, and wherein the fold guide member comprises a first guide member and a second guide member spaced apart from each other relative to the folding line.

In some embodiments, the foldable display apparatus may further include a solder resist formed on a first surface of the conductive layer, wherein the first surface of the conductive layer is opposite to a second surface of the conductive layer facing the protection layer.

In some embodiments, the foldable display apparatus may further include a plating layer disposed adjacent to the solder resist, and between the wiring pattern and the first and second display panels.

In some embodiments, the foldable display apparatus may further include a fold guide member disposed on a first surface of the solder resist, wherein the first surface of the solder resist is opposite to a second surface of the solder resist facing the conductive layer, and wherein the fold guide member comprises a first guide member and a second guide member spaced apart from each other relative to the folding line.

In some embodiments, a width of the groove may decrease in a direction of a thickness of the flexible electric connection unit.

In some embodiments, the groove may include a curved surface.

In some embodiments, a cross-section of the groove may have a V-shape or a U-shape.

In some embodiments, the first and second display panels may each include a display device.

According to some other embodiments of the inventive concept, a method of manufacturing a foldable display apparatus foldable along a folding line is provided. The method includes forming a flexible electric connection unit between a first display panel and a second display panel, wherein the first display panel is configured to display a first image and the second display panel is configured to display a second image, and wherein the flexible electric connection unit is configured to electrically connect the first and second display panels, the flexible electric connection unit comprising a groove overlapping with the folding line.

In some embodiments, forming the flexible electric connection unit may include forming a protection layer on a conductive layer, wherein the groove is formed on the protection layer, and forming a wiring pattern electrically connected to the conductive layer and the first and second display panels.

In some embodiments, the method may include forming a penetration in the protection layer, and forming the wiring pattern in the penetration, wherein the wiring pattern comprises a test region for performing an electrical test on the wiring pattern.

In some embodiments, the method may include forming a shielding layer covering the test region after the electrical test is performed on the wiring pattern.

DETAILED DESCRIPTION

Figure 1:
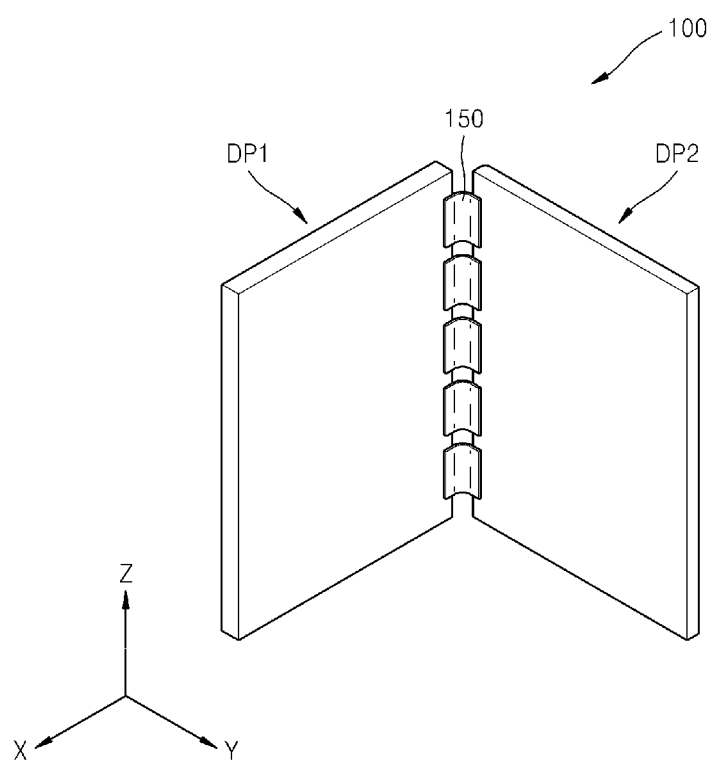
FIG. 1 is a schematic perspective view of a foldable display apparatus according to an embodiment of the inventive concept.

Reference will now be made to the different embodiments of the inventive concept, examples of which are illustrated in the accompanying drawings. Like reference numerals refer to like elements throughout. The embodiments are merely illustrative and the inventive concept should not be construed as being limited to the disclosed embodiments.

It will be understood that although the terms "first," "second," etc. may be used herein to describe various components, the components should not be limited by those terms. Instead, those terms are only used to distinguish one component from another.

As used herein, the singular forms "a," "an," and "the" are intended to include plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being formed on another layer, region, or component, it can be directly formed on the other layer, region, or component, or formed with one or more intervening layers, regions, or components being present.

It should be noted that the sizes of the elements in the drawings may be exaggerated for clarity.

Figure 2:
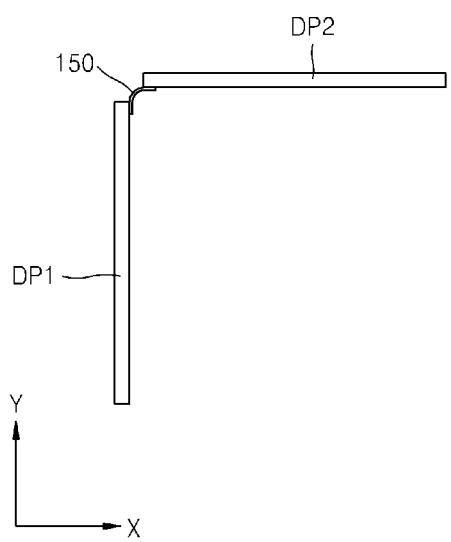
FIG. 2 is a plan view of the foldable display apparatus of FIG. 1.
Figure 3:
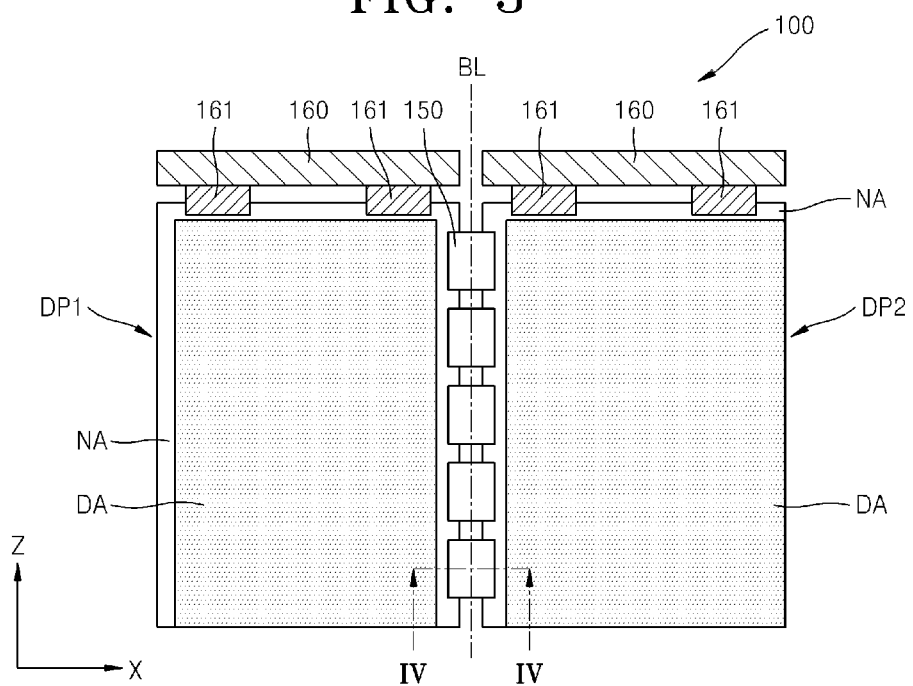
FIG. 3 is a front view of the foldable display apparatus of FIG. 1.
Figure 4:
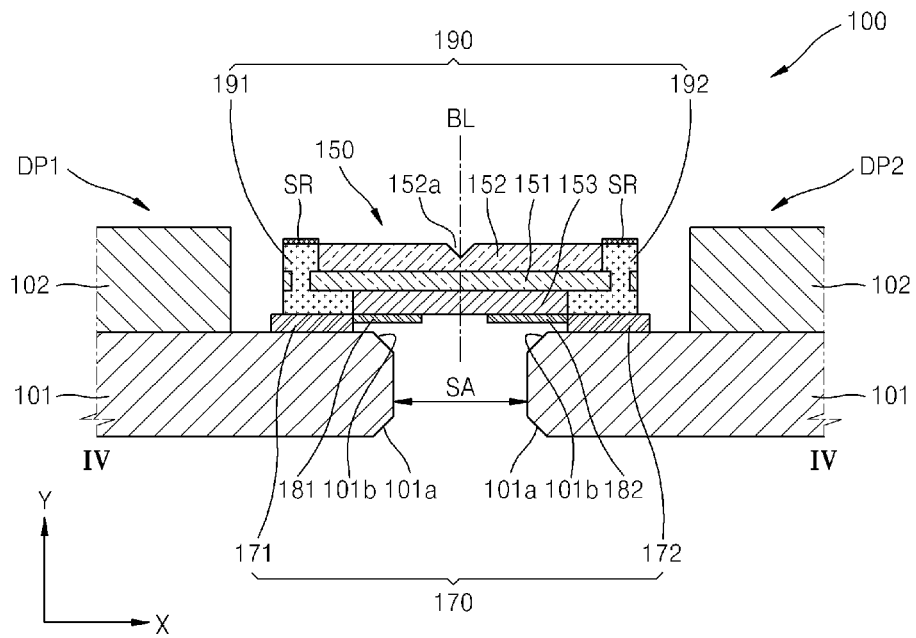
FIG. 4 is a cross-sectional view taken along line IV-IV of FIG. 3.

FIG. 1 is a schematic perspective view of a foldable display apparatus 100 according to an embodiment of the inventive concept. FIG. 2 is a plan view of the foldable display apparatus 100 of FIG. 1. FIG. 3 is a front view of the foldable display apparatus 100 of FIG. 1. FIG. 4 is a cross-sectional view taken along line IV-IV of FIG. 3.

Referring to FIGS. 1 through 4, the foldable display apparatus 100 includes a first display panel DP1, a second display panel DP2, and a flexible electric connection unit 150.

The foldable display apparatus 100 is foldable along an area between the first and second display panels DP1 and DP2. For example, the foldable display apparatus 100 may be folded along a folding line BL (see FIG. 4) on the flexible electric connection unit 150. The flexible electric connection unit 150 (and the folding line BL) is disposed between the first and second display panels DP1 and DP2. Accordingly, a user can adjust an angle between the first and second display panels DP1 and DP2 by folding the foldable display apparatus 100 along the folding line BL.

For example, in some embodiments, the angle between the first and second display panels DP1 and DP2 can be adjusted to 180°. The first display panel DP1 may display a first image and the second display panel DP2 may display a second image. In some embodiments, the first image may be the same as the second image. In other embodiments, the first image may be different from the second image. In some further embodiments, the first and second images may form part of a larger image.

In some other embodiments, the angle between the first and second display panels DP1 and DP2 can be adjusted to 0° such that the first and second display panels DP1 and DP2 face each other. Accordingly, the portability of the foldable display apparatus 100 is increased since the folded display apparatus 100 is more compact.

Furthermore, since the foldable display apparatus 100 can be folded freely, the foldable display apparatus 100 can simulate paper mediums such as books or newspapers.

Referring to FIG. 3, each of the first and second display panels DP1 and DP2 includes a display area DA and a non-display area NA. The display area DA is configured to display an image. The non-display NA is formed adjacent to the display area DA (for example, to the side of the display area DA).

The flexible electric connection unit 150 is connected to the non-display areas NA of the first and second display panels DP1 and DP2. The flexible electric connection unit 150 is flexible, and allows the foldable display apparatus 100 to be folded along the folding line BL.

Referring to FIG. 4, the first and second display panels DP1 and DP2 each includes a first substrate 101 and a second substrate 102. Although not illustrated, the first and second display panels DP1 and DP2 each includes a display device disposed between the first and second substrates 101 and 102 for realizing an image. The display device in the first and second display panels DP1 and DP2 may include, but is not limited to, a liquid crystal device or an organic light emitting device.

The first display panel DP1 and the second display panel DP2 are spaced apart from each other. For example, a shortest distance between the first and second display panels DP1 and DP2 may correspond to a distance between adjacent edges of the first substrates 101 of the first and second display panels DP1 and DP2. As shown in FIG. 4, the distance between adjacent edges of the first substrates 101 of the first and second display panels DP1 and DP2 defines a space SA between the first substrates 101.

The first substrates 101 of the first and second display panels DP1 and DP2 include lower cutting portions 101a and upper cutting portions 101b disposed opposite each other. The lower cutting portions 101a and upper cutting portions 101b are chamfered, thereby reducing mechanical interference between the first substrates 101 of the first and second display panels DP1 and DP2 when the foldable display apparatus 100 is folded.

In some particular embodiments, at least one of the first and second substrates 101 and 102 may be omitted and replaced with a thin film.

In some embodiments, the first substrate 101 may be larger than the second substrate 102, and the flexible electric connection unit 150 may be formed in a region on a surface of the first substrate 101 that is not covered by the second substrate 102.

The flexible electric connection unit 150 is connected to the first and second display panels DP1 and DP2. As shown in FIG. 4, the flexible electric connection unit 150 is connected to the first and second display panels DP1 and DP2 using connection members 170 disposed between the flexible electric connection unit 150 and the first display panel DP1 and between the flexible electric connection unit 150 and the second display panel DP2.

The connection members 170 electrically connect the flexible electric connection unit 150 to the first and second display panels DP1 and DP2. For example, the connection members 170 may include an anisotropic conductive film (ACF). The connection members 170 include a first connection member 171 connected to the first display panel DP1 and a second connection member 172 connected to the second display panel DP2.

Figure 5A:
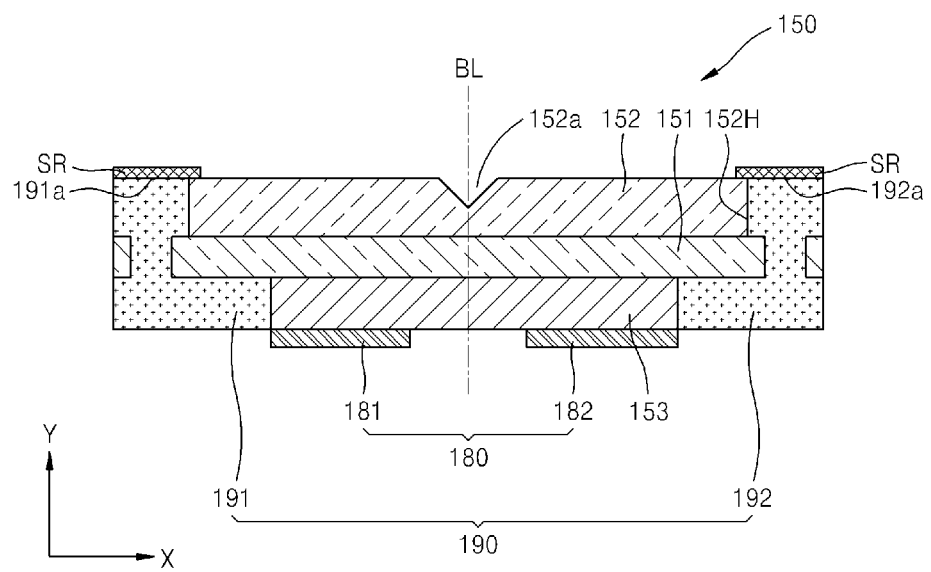
FIG. 5A is a magnified view of the flexible electric connection unit of FIG. 4.

FIG. 5A is a magnified view of the flexible electric connection unit 150 of FIG. 4. The flexible electric connection unit 150 is next described in more detail with reference to FIG. 5A.

The flexible electric connection unit 150 includes a conductive layer 151, a protection layer 152, a cover layer 153, a wiring pattern 190, and a fold guide member 180.

The conductive layer 151 is formed of a conductive metal (for example, the conductive layer 151 may be formed as a copper thin film).

The protection layer 152 is formed on the conductive layer 151. The protection layer 152 is formed of an insulating material (for example, polyimide). The protection layer 152 is formed on a surface of the conductive layer 151 (opposite the surface of the conductive layer 151 facing the connection member 170).

The protection layer 152 includes a groove 152a and a penetration 152H. The groove 152a is formed overlapping with the folding line BL. As described previously, the foldable display apparatus 100 can be folded along the folding line BL. Thus, the angle between the first and second display panels DP1 and DP2 can be adjusted by folding the flexible electric connection unit 150 along the folding line BL.

To improve folding characteristics of the flexible electric connection unit 150, the groove 152a may be formed extending parallel to and/or overlapping with the folding line BL. For example, the groove 152a may extend from a top to a bottom of the flexible electric connection unit 150.

A width of the groove 152a need not be uniform. For example, as shown in FIG. 5A, the width of the groove 152a may be reduced in a direction towards the conductive layer 151, such that a cross-section of the groove 152a is similar to a V-shape.

The groove 152a is formed having a predetermined depth that is less than a thickness of the protection layer 152, so that the conductive layer 151 is not exposed by the groove 152a.

The penetration 152H is formed by removing an edge region of the protection layer 152.

The wiring pattern 190 is formed in the penetration 152H, and is connected to the conductive layer 151 and the connection members 170.

Next, the wiring pattern 190 will be described in detail. As previously mentioned, the flexible electric connection unit 150 includes the wiring pattern 190. The wiring pattern 190 includes a first wiring pattern 191 and a second wiring pattern 192. For example, the wiring pattern 190 may include a plurality of the first wiring patterns 191 and a plurality of the second wiring patterns 192.

The first wiring pattern 191 is connected to the first connection member 171 and the second wiring pattern 192 is connected to the second connection member 172.

The first and second wiring patterns 191 and 192 are spaced apart from each other, but are electrically connected to each other through the conductive layer 151. A circuit unit (not shown) may be disposed in the first or second display panel DP1 or DP2. For example, the circuit unit may include a scan driving unit (not shown) disposed in a region of the non-display area NA of the first display panel DP1. An electric signal generated in the circuit unit may be applied to the first display panel DP1. Subsequently, the electric signal is applied to the second display panel DP2 through the first connection member 171, the first wiring pattern 191, the conductive layer 151, the second wiring pattern 192, and the second connection member 172. Accordingly, the circuit unit for applying the electric signal for realizing an image on the first and second display panels DP1 and DP2 need not be disposed in both the first and second display panels DP1 and DP2. Instead, as described above, the circuit unit may be disposed in one of the first and second display panels DP1 and DP2.

The first and second wiring patterns 191 and 192 include a first test region 191a and a second test region 192a, respectively. The first and second test regions 191a and 192a correspond to areas on respective top surfaces of the first and second wiring patterns 191 and 192 (i.e., surfaces that are exposed by the penetrations 152H of the protection layer 152).

The first and second test regions 191a and 192a are regions for measuring and testing electric signals applied to the first and second display panels DP1 and DP2. As described above, according to an exemplary embodiment, the electric signal generated in the scan driving unit disposed in a region of the non-display area NA of the first display panel DP1 is applied to the first display panel DP1, and the electric signal is then applied to the second display panel DP2 through the first connection member 171, the first wiring pattern 191, the conductive layer 151, the second wiring pattern 192, and the second connection member 172.

A testing apparatus (not shown) may be disposed in the first and second test regions 191a and 192a to measure the electric signal from the first and second test regions 191a and 192a, and determine whether the electric signal applied to the first display panel DP1 is stable, and whether the electric signal applied to the second display panel DP2 (through the first connection member 171, the first wiring pattern 191, the conductive layer 151, and the second wiring pattern 192) is stable. The testing apparatus may include, for example, a contact type probe.

Figure 5B:
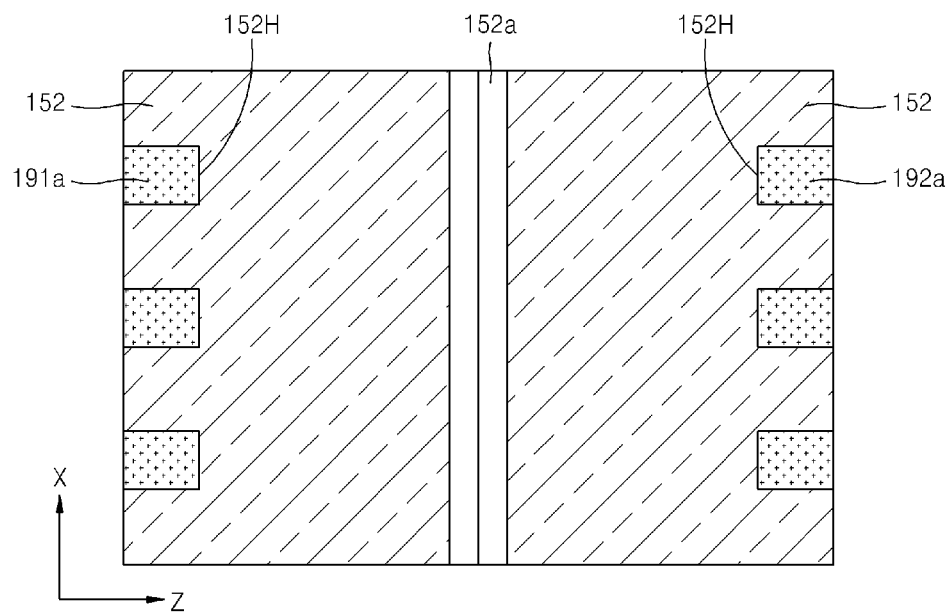
FIGS. 5B and 5C are views of the flexible electric connection unit of FIG. 5A at different stages of fabrication.
Figure 5C:
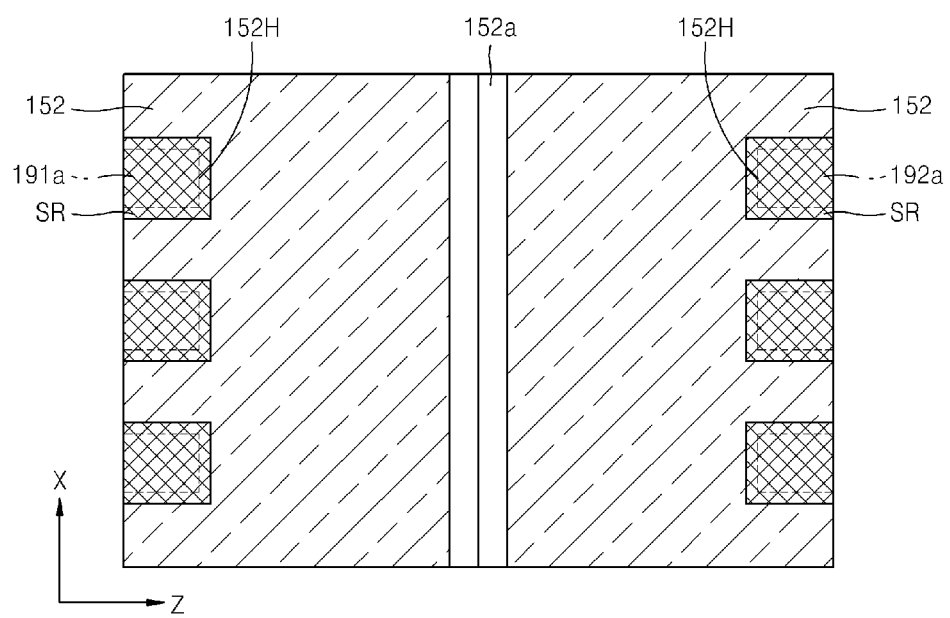

FIGS. 5B and 5C are views of the flexible electric connection unit 150 of FIG. 5A at different stages of fabrication.

Referring to FIG. 5B, the plurality of first test regions 191a may be formed on top surfaces of the first wiring patterns 191, and the plurality of second test regions 192a may be formed on top surfaces of the second wiring patterns

192. Also, the first test regions 191a of the first wiring pattern 191 and the second test regions 192a of the second wiring pattern 192 may be formed in regions corresponding to the penetrations 152H of the protection layer 152.

Referring to FIG. 5C, a shielding layer SR is then formed covering the first and second test regions 191a and 192a, so as to prevent the first and second test regions 191a and 192a from being contaminated by foreign matters and gases. The shielding layer SR is formed of an insulating material. For example, the shielding layer SR may be a solder resist.

As shown in FIG. 5C, a size of the shielding layer SR may be greater than (or at least the same as) a size of the first and second test regions 191a and 192a. In some embodiments, an area of the shielding layer SR may be reduced so that the shielding layer SR is disposed further away from the folding line BL and the groove 152a.

During the manufacture of the foldable display apparatus 100, an electric signal (for testing purposes) is applied to the first and second display panels DP1 and DP2 and measured through the first and second test regions 191a and 192a. Thus, the first and second test regions 191a and 192a allow the electric signal between the first and second display panels DP1 and DP2 to be measured.

It should be noted that the shielding layer SR is not present on the first and second test regions 191a and 192a when the electric signal between the first and second display panels DP1 and DP2 is being measured. After the electric signal is measured, the shielding layer SR is formed covering the first and second test regions 191a and 192a, so as to protect the first and second test regions 191a and 192a.

In some embodiments, the shielding layer SR may be selectively removed to allow electric testing on the first and second test regions 191a and 192a, and reapplied covering the first and second test regions 191a and 192a after the electric testing is completed.

The cover layer 153 is formed on a surface of the conductive layer 151 (opposite the surface where the protection layer 152 is formed), so as to protect the surface of the conductive layer 151. The cover layer 153 may be formed of an insulating material, such as polyimide or another resin.

The fold guide member 180 is formed on a surface of the cover layer 153 (opposite the surface facing the conductive layer 151). The fold guide member 180 includes a first guide member 181 and a second guide member 182. The first and second guide members 181 and 182 are disposed apart from each other relative to the folding line BL. In particular, the first guide member 181 is disposed closer to the first display panel DP1 relative to the folding line BL, and the second guide member 182 is disposed closer to the second display panel DP2 relative to the folding line BL.

The first and second guide members 181 and 182 allow the flexible electric connection unit 150 to be easily folded along the folding line BL, by focusing a stress on a region corresponding to the folding line BL when the foldable display apparatus 100 is folded. Accordingly, the first and second guide members 181 and 182 are disposed symmetrically relative to the folding line BL.

Since the first and second guide members 181 and 182 are disposed in contact with the cover layer 153, the first and second guide members 181 and 182 structurally reinforce the cover layer 153 when the foldable display apparatus 100 is folded along the folding line BL.

The first and second guide members 181 and 182 may include various materials. For example, the first and second guide members 181 and 182 may include a tape containing Al (Aluminum). The tape may further include polyethylene terephthalate (PET) (polyester) or other materials that allow the first and second guide members 181 and 182 to easily adhere to the cover layer 153.

As shown in FIG. 3, the foldable display apparatus 100 may include at least one circuit board 160.

The circuit board 160 is configured to generate electric signals for driving the first and second display panels DP1 and DP2. The circuit board 160 is connected to the first and second display panels DP1 and DP2 through circuit board connection members 161.

The circuit board 160 may be disposed relative to the folding line BL. For example, as shown in FIG. 3, the circuit boards 160 on the first and second display panels DP1 and DP2 may be spaced apart from each other relative to the folding line BL. In some embodiments, the circuit board 160 may be disposed on one of the surfaces of the first and second display panels DP1 and DP2 (opposite to the surface where the image is displayed).

As previously mentioned, the flexible electric connection unit 150 is disposed between the first and second display panels DP1 and DP2, and electrically connects the first and second display panels DP1 and DP2. Since the flexible electric connection unit 150 is formed of a flexible material overlapping with the folding line BL, the angle between the first and second display panels DP1 and DP2 can therefore be easily adjusted by folding the flexible electric connection unit 150.

The flexible electric connection unit 150 includes the groove 152a formed on the top surface of the protection layer 152 along the folding line BL. As a result of the V-shaped groove 152a, the flexible electric connection unit 150 can be more easily folded along the folding line BL.

The fold guide member 180 is formed on the surface of the cover layer 153 (opposite the surface facing the conductive layer 151). As previously mentioned, the fold guide member 180 includes the first and second guide members 181 and 182. The first and second guide members 181 and 182 are disposed opposite each other with respect to the folding line BL, and allow the flexible electric connection unit 150 to be easily folded along the folding line BL. The first and second guide members 181 and 182 structurally reinforce the cover layer 153 when the foldable display apparatus 100 is folded along the folding line BL.

Since the flexible electric connection unit 150 electrically connects the first and second display panels DP1 and DP2, the flexible electric connection unit 150 may apply at least one electric signal simultaneously to the first and second display panels DP1 and DP2. In other words, the first and second display panels DP1 and DP2 may be used as a single display screen. A circuit unit (not shown) may be formed in any one of the first and second display panels DP1 and DP2, and the circuit unit is configured to simultaneously apply at least one electric signal to the first and second display panels DP1 and DP2. In some embodiments, by increasing the display area DA, the first and second display panels DP1 and DP2 may be formed having a slim bezel structure.

The first and second wiring patterns 191 and 192 include the first and second test regions 191a and 192a, respectively. The first and second display panels DP1 and DP2 can be tested by applying electric signals to the first and second display panels DP1 and DP2, and measuring the electric signals using the first and second test regions 191a and 192a. After the electrical test is performed on the first and second display panels DP1 and DP2, the shielding layer SR is formed on the first and second test regions 191a and 192a, so as to protect the first and second test regions 191a and 192a from foreign particles (which may cause short-circuits).

In some embodiments, the shielding layer SR may be selectively removed to allow electric testing on the first and second test regions 191a and 192a, and reapplied covering the first and second test regions 191a and 192a after the electric testing is completed.

Figure 6:
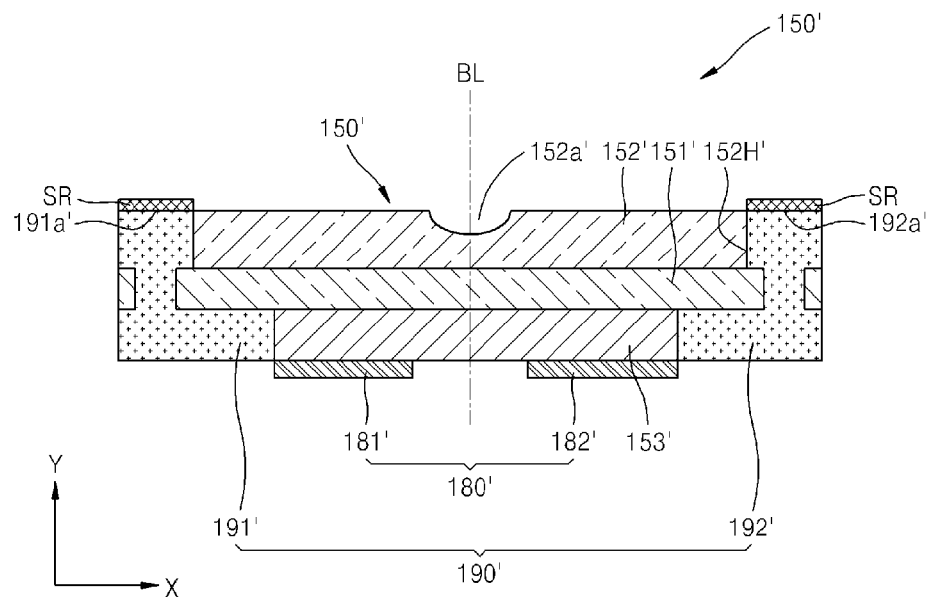
FIG. 6 is a magnified view of a flexible electric connection unit according to another embodiment.

FIG. 6 is a magnified view of a flexible electric connection unit 150' according to another embodiment. More particularly, the embodiment in FIG. 6 is modified from the embodiment of FIG. 5A. In the interest of clarity, only differences between the flexible electric connection units 150 (FIG. 5A) and 150' (FIG. 6) will be described.

Referring to FIG. 6, the flexible electric connection unit 150' includes a conductive layer 151', a protection layer 152', a cover layer 153', a wiring pattern 190', and a fold guide member 180'.

The protection layer 152' includes a groove 152a' and a penetration 152H'.

A width of the groove 152a' need not be uniform. For example, as shown in FIG. 6, the width of the groove 152a' may be reduced in a directions towards the conductive layer 151', such that a cross-section of the groove 152a' has a curved surface (similar to a U-shape).

The wiring pattern 190' includes a first wiring pattern 191' and a second wiring pattern 192'. The first and second wiring patterns 191' and 192' include a first test region 191a' and a second test region 192a', respectively. The first and second test regions 191a' and 192a' are covered by a shielding layer SR.

In the flexible electric connection unit 150', the groove 152a' is formed having a curved surface, so as to prevent large stresses from being focused on a region of the groove 152a' when the flexible electric connection unit 150' is folded along the folding line BL. Accordingly, the groove 152a' helps to protect the flexible electric connection unit 150' from mechanical damage during folding.

Figure 7:
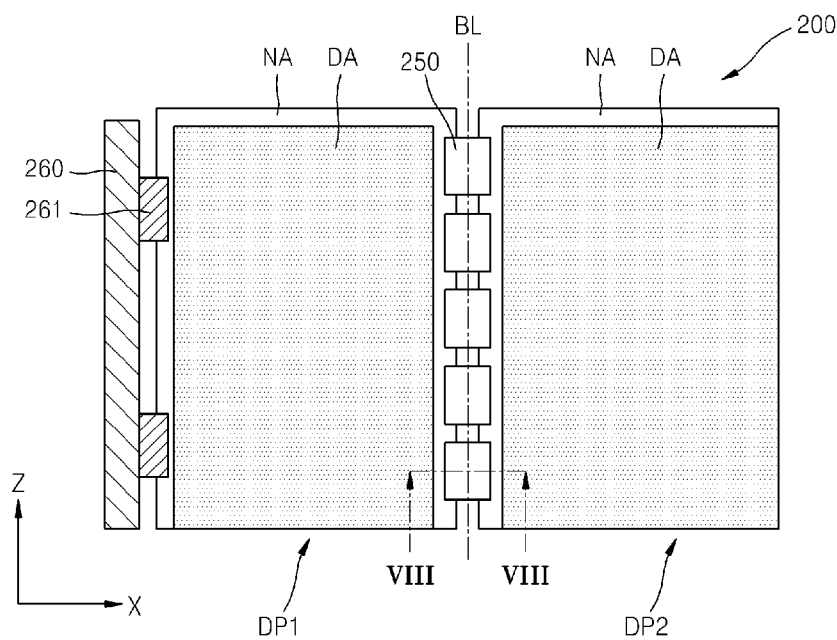
FIG. 7 is a schematic front view of a foldable display apparatus according to another embodiment of the inventive concept.
Figure 8:
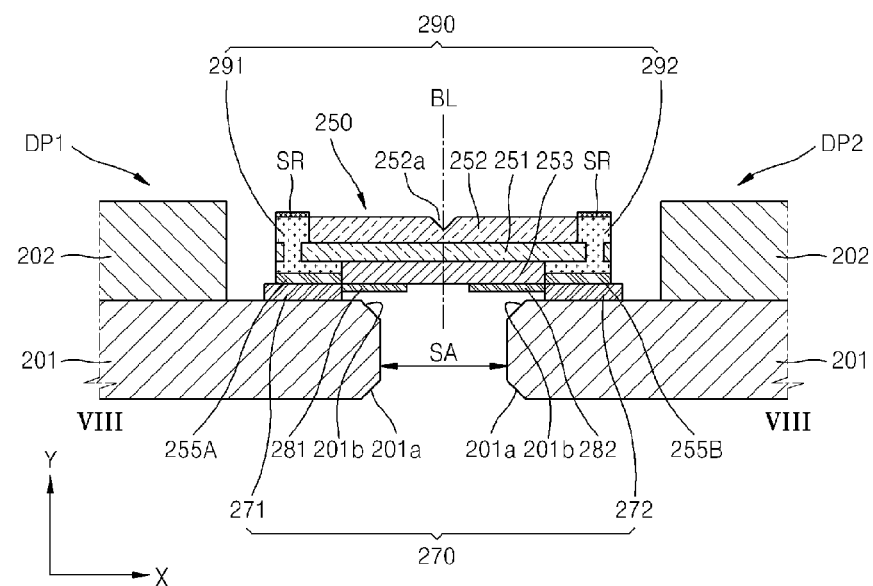
FIG. 8 is a cross-sectional view taken along line VIII-VIII of FIG. 7.
Figure 9:
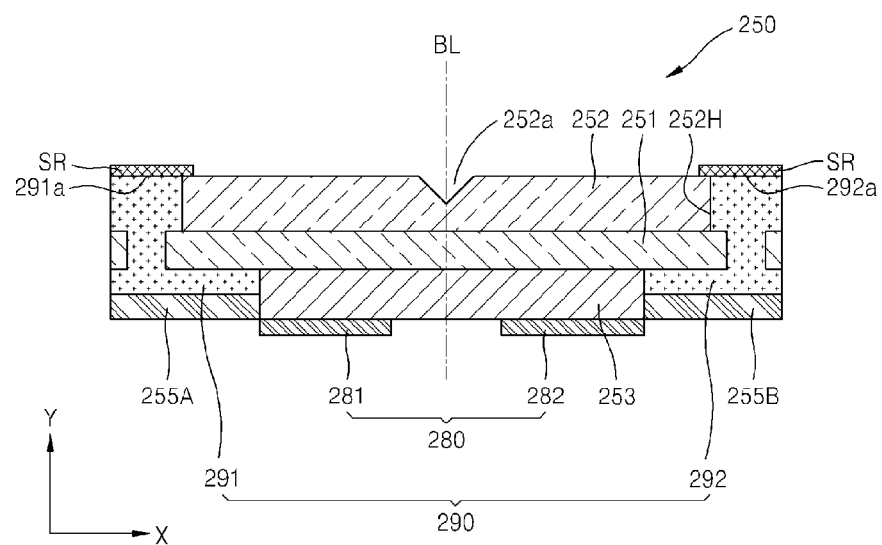
FIG. 9 is a magnified view of the flexible electric connection unit of FIG. 8.

FIG. 7 is a schematic front view of a foldable display apparatus 200 according to another embodiment of the inventive concept. FIG. 8 is a cross-sectional view taken along line VIII-VIII of FIG. 7. FIG. 9 is a magnified view of the flexible electric connection unit 250 of FIG. 8.

Referring to FIGS. 7 through 9, the foldable display apparatus 200 includes a first display panel DP1, a second display panel DP2, and a flexible electric connection unit 250.

The foldable display apparatus 200 is foldable along an area between the first and second display panels DP1 and DP2. For example, the foldable display apparatus 200 may be folded along a folding line BL (see FIG. 8) on the flexible electric connection unit 250. The flexible electric connection unit 250 (and the folding line BL) is disposed between the first and second display panels DP1 and DP2. Accordingly, a user can adjust an angle between the first and second display panels DP1 and DP2 by folding the foldable display apparatus 200 along the folding line BL.

For example, in some embodiments, the angle between the first and second display panels DP1 and DP2 can be adjusted to 180°. The first display panel DP1 may display a first image and the second display panel DP2 may display a second image. In some embodiments, the first image may be the same as the second image. In other embodiments, the first image may be different from the second image. In some further embodiments, the first and second images may form part of a larger image.

In some other embodiments, the angle between the first and second display panels DP1 and DP2 can be adjusted to 0° such that the first and second display panels DP1 and DP2 face each other. Accordingly, the portability of the foldable display apparatus 200 is increased since the folded display apparatus 200 is more compact.

Furthermore, since the foldable display apparatus 200 can be folded freely, the foldable display apparatus 200 can simulate paper mediums such as books or newspapers.

Referring to FIG. 7, each of the first and second display panels DP1 and DP2 includes a display area DA and a non-display area NA. The display area DA is configured to display an image. The non-display NA is formed adjacent to the display area DA (for example, to the side of the display area DA).

The flexible electric connection unit 250 is connected to the non-display areas NA of the first and second display panels DP1 and DP2. The flexible electric connection unit 150 is flexible, and allows the foldable display apparatus 200 to be folded along the folding line BL.

Referring to FIG. 8, the first and second display panels DP1 and DP2 each includes a first substrate 201 and a second substrate 202. Although not illustrated, the first and second display panels DP1 and DP2 each includes a display device disposed between the first and second substrates 201 and 202 for realizing an image. The display device in the first and second display panels DP1 and DP2 may include, but is not limited to, a liquid crystal device or an organic light emitting device.

The first display panel DP1 and the second display panel DP2 are spaced apart from each other. For example, a shortest distance between the first and second display panels DP1 and DP2 may correspond to a distance between adjacent edges of the first substrates 201 of the first and second display panels DP1 and DP2. As shown in FIG. 8, the distance between adjacent edges of the first substrates 201 of the first and second display panels DP1 and DP2 defines a space SA between the first substrates 201.

The first substrates 201 of the first and second display panels DP1 and DP2 include lower cutting portions 201a and upper cutting portions 201b disposed opposite each other. The lower cutting portions 201a and upper cutting portions 201b are chamfered, thereby reducing mechanical interference between the first substrates 201 of the first and second display panels DP1 and DP2 when the foldable display apparatus 200 is folded.

In some particular embodiments, at least one of the first and second substrates 201 and 202 may be omitted and replaced with a thin film.

In some embodiments, the first substrate 201 may be larger than the second substrate 202, and the flexible electric connection unit 250 may be formed in a region on a surface of the first substrate 201 that is not covered by the second substrate 202.

The flexible electric connection unit 250 is connected to the first and second display panels DP1 and DP2. As shown in FIG. 8, the flexible electric connection unit 250 is connected to the first and second display panels DP1 and DP2 using connection members 270 disposed between the flexible electric connection unit 250 and the first display panel DP1 and between the flexible electric connection unit 250 and the second display panel DP2.

The connection members 270 electrically connect the flexible electric connection unit 250 to the first and second display panels DP1 and DP2. For example, the connection member 270 may include an anisotropic conductive film (ACF). The connection members 270 include a first connection member 271 connected to the first display panel DP1 and a second connection member 272 connected to the second display panel DP2.

FIG. 9 is a magnified view of the flexible electric connection unit 250 of FIG. 8. The flexible electric connection unit 250 is next described in more detail.

The flexible electric connection unit 250 includes a conductive layer 251, a protection layer 252, a solder resist 253, a wiring pattern 290, a fold guide member 280, and plating layers 255A and 255B.

The conductive layer 251 is formed of a conductive metal (for example, the conductive layer 251 may be formed as a copper thin film).

The protection layer 252 is formed on the conductive layer 251. The protection layer 252 is formed of an insulating material (for example, polyimide). The protection layer 252 is formed on a surface of the conductive layer 251 (opposite the surface of the conductive layer 251 facing the connection member 270).

The protection layer 252 includes a groove 252a and a penetration 252H. The groove 252a is formed overlapping with the folding line BL. As described previously, the foldable display apparatus 200 can be folded along the folding line BL. Thus, the angle between the first and second display panels DP1 and DP2 can be adjusted by folding the flexible electric connection unit 250 along the folding line BL.

To improve the folding characteristics of the flexible electric connection unit 250, the groove 252a may be formed extending parallel to and/or overlapping with the folding line BL. For example, the groove 252a may extend from a top to a bottom of the flexible electric connection unit 250.

A width of the groove 252a need not be uniform. For example, as shown in FIG. 9, the width of the groove 252a may be reduced in a direction towards the conductive layer 251, such that a cross-section of the groove 252a is similar to a V-shape.

The groove 252a is formed having a predetermined depth that is less than a thickness of the protection layer 252, so that the conductive layer 251 is not exposed by the groove 252a.

The penetration 252H is formed by removing an edge region of the protection layer 252.

The wiring pattern 290 is formed in the penetration 252H, and is connected to the conductive layer 251 and the connection members 270 through the plating layers 255A and 255B.

The wiring pattern 290 includes a first wiring pattern 291 and a second wiring pattern 292. For example, the wiring pattern 290 may include a plurality of the first wiring patterns 291 and a plurality of the second wiring patterns 292.

The first wiring pattern 291 is connected to the first connection member 271 through the plating layer 255A, and the second wiring pattern 292 is connected to the second connection member 272 through the plating layer 255B.

The first and second wiring patterns 291 and 292 are spaced apart from each other, but are electrically connected to each other through the conductive layer 251. A circuit unit (not shown) may be disposed in the first or second display panel DP1 or DP2. For example, the circuit unit may include a data driving unit (not shown) disposed in a region of the non-display area NA of the first display panel DP1. An electric signal generated in the circuit unit may be applied to the first display panel DP1. Subsequently, the electric signal is applied to the second display panel DP2 through the first connection member 271, the first wiring pattern 291, the conductive layer 251, the second wiring pattern 292, and the second connection member 272. Accordingly, the circuit unit for applying the electric signal for realizing an image on the first and second display panels DP1 and DP2 need not be disposed in both the first and second display panels DP1 and DP2. Instead, as described above, the circuit unit may be disposed in one of the first and second display panels DP1 and DP2.

The first and second wiring patterns 291 and 292 include a first test region 291a and a second test region 292a, respectively. The first and second test regions 291a and 292a correspond to areas on respective top surfaces of the first and second wiring patterns 291 and 292 (i.e., surfaces that are exposed by the penetrations 252H of the protection layer 252).

The first and second test regions 291a and 292a are regions for measuring and testing electric signals applied to the first and second display panels DP1 and DP2. As described above, according to an exemplary embodiment, the electric signal generated in the data driving unit disposed in a region of the non-display area NA of the first display panel DP1 is applied to the first display panel DP1, and the electric signal is then applied to the second display panel DP2 through the first connection member 271, the first wiring pattern 291, the conductive layer 251, the second wiring pattern 292, and the second connection member 272.

A testing apparatus (not shown) may be disposed in the first and second test regions 291a and 292a to measure the electric signal from the first and second test regions 291a and 292a, and determine whether the electric signal applied to the first display panel DP1 is stable, and whether the electric signal applied to the second display panel DP2 (through the first connection member 271, the first wiring pattern 291, the conductive layer 251, and the second wiring pattern 292) is stable. The test apparatus may include, for example, a contact type probe.

Although not illustrated, the plurality of first test regions 291a may be formed on the top surfaces of the first wiring patterns 291, and the plurality of second test regions 292a may be formed on the top surfaces of the second wiring patterns 292.

A shielding layer SR is formed covering the first and second test regions 291a and 292a, so as to prevent the first and second test regions 291a and 292a from being contaminated by foreign matters and gases. The shielding layer SR is formed of an insulating material. For example, the shielding layer SR may be a solder resist.

A size of the shielding layer SR may be greater than (or at least the same as) a size of the first and second test regions 291a and 292a. In some embodiments, an area of the shielding layer SR may be reduced so that the shielding layer SR is disposed further away from the folding line BL and the groove 252a.

During the manufacture of the foldable display apparatus 200, an electric signal (for testing purposes) is applied to the first and second display panels DP1 and DP2 and measured through the first and second test regions 291a and 292a. Thus, the first and second test regions 291a and 292a allow the electric signal between the first and second display panels DP1 and DP2 to be measured.

It should be noted that the shielding layer SR is not present on the first and second test regions 291a and 292a when the electric signal between the first and second display panels DP1 and DP2 is being measured. After the electric signal is measured, the shielding layer SR is formed covering the first and second test regions 291a and 292a, so as to protect the first and second test regions 291a and 292a.

In some embodiments, the shielding layer SR may be selectively removed to allow electric testing on the first and second test regions 291a and 292a, and reapplied covering the first and second test regions 291a and 292a after the electric testing is completed.

The solder resist 253 is formed on a surface of the conductive layer 251 (opposite the surface where the protection layer 252 is formed), so as to protect the surface of the conductive layer 251. In some embodiments, the solder resist 253 need not cover the wiring pattern 290.

The plating layers 255A and 255B are formed adjacent to the solder resist 253 and contact the first and second wiring patterns 291 and 292, respectively. The plating layers 255A and 2255B may include one or more metals that can be plated (such as tin (Sn)).

The plating layers 255A and 255B increase the durability of the connections between the first wiring patterns 291 and the first connection members 271, and the durability of the connections between the second wiring patterns 292 and the second connection members 272. Also, the plating layers 255A and 255B reduce electrical resistance in the electric connections between the first wiring patterns 291 and the first connection members 271, and between the second wiring patterns 292 and the second connection members 272, thereby improving the speed and stability of electric signal transmission from the first display panel DP1 to the second display panel DP2.

The fold guide member 280 is formed on a surface of the solder resist 253 (opposite the surface facing the conductive layer 251). The fold guide member 280 includes a first guide member 281 and a second guide member 282. The first and second guide members 281 and 282 are disposed apart from each other relative to the folding line BL. In particular, the first guide member 281 is disposed closer to the first display panel DP1 relative to the folding line BL, and the second guide member 282 is disposed closer to the second display panel DP2 relative to the folding line BL.

The first and second guide members 281 and 282 allow the flexible electric connection unit 250 to be easily folded along the folding line BL, by focusing a stress on a region corresponding to the folding line BL when the foldable display apparatus 200 is folded. Accordingly, the first and second guide members 281 and 282 are disposed symmetrically relative to the folding line BL.

Since the first and second guide members 281 and 282 are disposed in contact with the solder resist 253, the first and second guide members 281 and 282 structurally reinforce the solder resist 253 when the foldable display apparatus 200 is folded along the folding line BL.

The first and second guide members 281 and 282 may include various materials. For example, the first and second guide members 281 and 282 may include a tape containing Al (Aluminum). The tape may further include PET (polyester) or other materials that allow the first and second guide members 281 and 282 to easily adhere to the solder resist 253.

As shown in FIG. 7, the foldable display apparatus 200 may include at least one circuit board 260.

The circuit board 260 is configured to generate electric signals for driving the first and second display panels DP1 and DP2. The circuit board 260 is connected to the first display panel DP1 through a circuit board connection member 261. The first and second display panels DP1 and DP2 can be driven simultaneously or separately.

The circuit board 260 may be disposed relative to the folding line BL. For example, the circuit board 260 may be disposed at a side of the first display panel DP1 (opposite the side where the folding line BL is located), as shown in FIG. 7. In some embodiments, the circuit board 260 may be disposed on one of the surfaces of the first display panel DP1 (opposite to the surface where the image is displayed).

Since the first and second display panels DP1 and DP2 are electrically connected to each other by the flexible electric connection unit 250, a signal generated in the circuit board 260 may be transmitted to the second display panel DP2 through the first display panel DP1.

As previously mentioned, the flexible electric connection unit 250 is disposed between the first and second display panels DP1 and DP2, and electrically connects the first and second display panels DP1 and DP2. Since the flexible electric connection unit 250 is formed of a flexible material overlapping with the folding line BL, the angle between the first and second display panels DP1 and DP2 can therefore be easily adjusted by folding the flexible electric connection unit 250.

The flexible electric connection unit 250 includes the groove 252a formed on the top surface of the protection layer 252 along the folding line BL. As a result of the V-shaped groove 252a, the flexible electric connection unit 250 can be more easily folded along the folding line BL.

As previously mentioned, the fold guide member 280 includes the first and second guide members 281 and 282. The first and second guide members 281 and 282 are disposed opposite each other with respect to the folding line BL, and allow the flexible electric connection unit 250 to be easily folded along the folding line BL. The first and second guide members 281 and 282 structurally reinforce the solder resist 253 when the foldable display apparatus 200 is folded along the folding line BL.

Since the flexible electric connection unit 250 electrically connects the first and second display panels DP1 and DP2, the flexible electric connection unit 250 may apply at least one electric signal simultaneously to the first and second display panels DP1 and DP2. In other words, the first and second display panels DP1 and DP2 may be used as a single display screen.

The first and second wiring patterns 291 and 292 include the first and second test regions 291a and 292a, respectively. The first and second display panels DP1 and DP2 can be tested by applying electric signals to the first and second display panels DP1 and DP2, and measuring the electric signals using the first and second test regions 291a and 292a. After the electrical test is performed on the first and second display panels DP1 and DP2, the shielding layer SR is formed on the first and second test regions 291a and 292a, so as to protect the first and second test regions 291a and 292a from foreign particles (which may cause short-circuits).

In some embodiments, the shielding layer SR may be selectively removed to allow electric testing on the first and second test regions 291a and 292a, and reapplied covering the first and second test regions 291a and 292a after the electric testing is completed.

Figure 10:
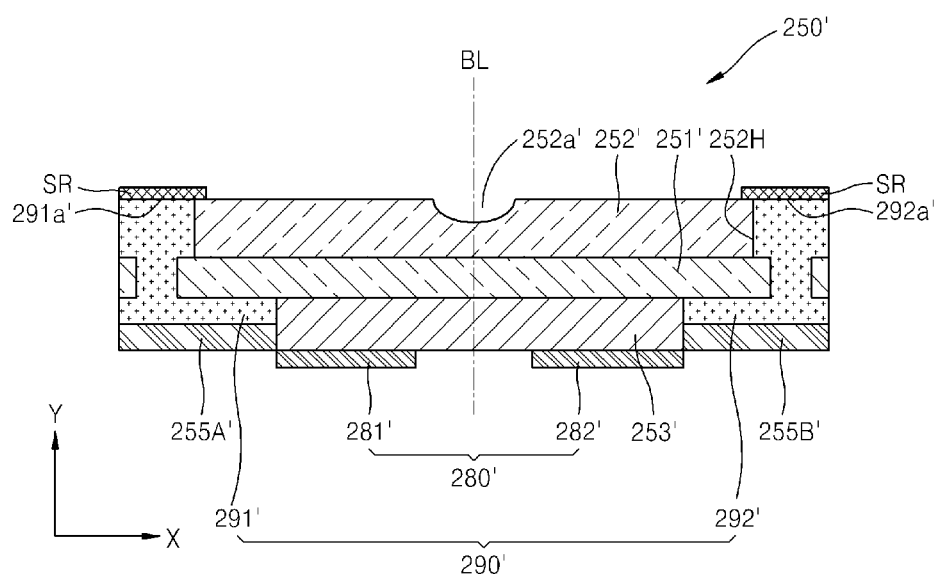
FIG. 10 is a magnified view of a flexible electric connection unit according to another embodiment.

FIG. 10 is a magnified view of a flexible electric connection unit 250' according to another embodiment. More particularly, the embodiment in FIG. 10 is modified from the embodiment of FIG. 9. In the interest of clarity, only differences between the flexible electric connection units 250 (FIG. 9) and 250' (FIG. 10) will be described.

The flexible electric connection unit 250' includes a conductive layer 251', a protection layer 252', a solder resist 253', a wiring pattern 290', and a fold guide member 280'.

The protection layer 252' includes a groove 252a' and a penetration 252H'.

A width of the groove 252a' need not be uniform. For example, as shown in FIG. 10, the width of the groove 252a' may be reduced towards the conductive layer 251', such that a cross-section of the groove 252a' has a curved surface (similar to a U-shape).

The wiring pattern 290' includes a first wiring pattern 291' and a second wiring pattern 292'. The first and second wiring patterns 291' and 292' include a first test region 291a' and a second test region 292a', respectively. The first and second test regions 291a' and 292a' are covered by a shielding layer SR.

In the flexible electric connection unit 250', the groove 252a' is formed having a curved surface, so as to prevent large stresses from being focused on a region of the groove 252a' when the flexible electric connection unit 250' is folded along the folding line BL. Accordingly, the groove 252a' helps to protect the flexible electric connection unit 250' from mechanical damage during folding.

It should be appreciated by one of ordinary skill in the art that the foldable display apparatus according to the different embodiments of this inventive concept may improve device portability and user experience.

While one or more embodiments of the inventive concept have been described with reference to the figures, it will be understood by those of ordinary skill in the art that various changes may be made to the different embodiments without departing from the spirit and scope of the present disclosure.

What is claimed is:

1. A foldable display apparatus foldable along a folding line, the foldable display apparatus comprising:
    a first display panel for displaying a first image;
    a second display panel for displaying a second image, wherein the second display panel is spaced apart from the first display panel;
    a flexible electric connection unit disposed between the first and second display panels and electrically connecting the first and second display panels, the flexible electric connection unit comprising a groove overlapping with the folding line and a fold guide member comprising a first guide member and a second guide member that are spaced apart from each other relative to the folding line.

2. The foldable display apparatus of claim 1, wherein the flexible electric connection unit comprises a conductive layer, a protection layer disposed on the conductive layer, and a wiring pattern electrically connected to the conductive layer and the first and second display panels, and
    wherein the groove is disposed on the protection layer.

3. The foldable display apparatus of claim 2, wherein the protection layer includes a penetration, and the wiring pattern is disposed in the penetration, the wiring pattern comprising a test region for performing an electrical test on the wiring pattern.

4. The foldable display apparatus of claim 3, further comprising a shielding layer covering the test region and spaced apart from the folding line.

5. The foldable display apparatus of claim 4, wherein the shielding layer is disposed covering the test region after the electrical test is performed on the wiring pattern.

6. The foldable display apparatus of claim 2, wherein the wiring pattern comprises at least one first wiring pattern electrically connected to the first display panel via a first connection member, and at least one second wiring pattern electrically connected to the second display pattern via a second connection member.

7. The foldable display apparatus of claim 6, wherein the at least one first wiring pattern and the at least one second wiring pattern are spaced apart from each other relative to the folding line.

8. The foldable display apparatus of claim 2, further comprising a cover layer disposed on a first surface of the conductive layer, wherein the first surface of the conductive layer is opposite to a second surface of the conductive layer facing the protection layer.

9. The foldable display apparatus of claim 8, wherein the first guide member is disposed in contact with a first surface of the cover layer and the second guide member is disposed in contact with a second surface of the cover layer, and wherein the first surface of the cover layer is opposite to the second surface of the cover layer facing the conductive layer.

10. The foldable display apparatus of claim 2, further comprising a solder resist formed on a first surface of the conductive layer, wherein the first surface of the conductive layer is opposite to a second surface of the conductive layer facing the protection layer.

11. The foldable display apparatus of claim 10, further comprising a plating layer disposed adjacent to the solder resist, and between the wiring pattern and the first and second display panels.

12. The foldable display apparatus of claim 10, wherein the first guide member is disposed on a first surface of the solder resist and wherein the second guide member is disposed on a second surface of the solder resist, and wherein the first surface of the solder resist is opposite to the second surface of the solder resist facing the conductive layer.

13. The foldable display apparatus of claim 1, wherein a width of the groove decreases in a direction of a thickness of the flexible electric connection unit.

14. The foldable display panel of claim 1, wherein the groove comprises a curved surface.

15. The foldable display panel of claim 1, wherein a cross-section of the groove has a V-shape or a U-shape.

16. The foldable display panel of claim 1, wherein the first and second display panels each comprises a display device.

17. A method of manufacturing a foldable display apparatus foldable along a folding line, the method comprising:
    forming a flexible electric connection unit between a first display panel and a second display panel,
    wherein the first display panel is configured to display a first image and the second display panel is configured to display a second image, and
    wherein the flexible electric connection unit is configured to electrically connect the first and second display panels, the flexible electric connection unit comprising a groove overlapping with the folding line and a fold guide member comprising a first guide member and a second guide member that are spaced apart from each other relative to the folding line.

18. The method of claim 17, wherein forming the flexible electric connection unit comprises:
    forming a protection layer on a conductive layer, wherein the groove is formed on the protection layer, and
    forming a wiring pattern electrically connected to the conductive layer and the first and second display panels.

19. The method of claim 18, further comprising:
    forming a penetration in the protection layer, and
    forming the wiring pattern in the penetration, wherein the wiring pattern comprises a test region for performing an electrical test on the wiring pattern.

20. The method of claim 19, further comprising:
   forming a shielding layer covering the test region after the electrical test is performed on the wiring pattern.

\* \* \* \* \*